United States Patent
Mikami

(10) Patent No.: US 12,424,812 B2
(45) Date of Patent: Sep. 23, 2025

(54) OPTICAL AMPLIFICATION DEVICE AND OPTICAL AMPLIFICATION METHOD

(71) Applicant: NEC Corporation, Tokyo (JP)

(72) Inventor: Satoshi Mikami, Tokyo (JP)

(73) Assignee: NEC CORPORATION, Tokyo (JP)

(*) Notice: Subject to any disclaimer, the term of this patent is extended or adjusted under 35 U.S.C. 154(b) by 1106 days.

(21) Appl. No.: 17/423,071

(22) PCT Filed: Jan. 22, 2020

(86) PCT No.: PCT/JP2020/002070
§ 371 (c)(1),
(2) Date: Jul. 14, 2021

(87) PCT Pub. No.: WO2020/158532
PCT Pub. Date: Aug. 6, 2020

(65) Prior Publication Data
US 2022/0102932 A1    Mar. 31, 2022

(30) Foreign Application Priority Data

Jan. 30, 2019  (JP) .................. 2019-014765

(51) Int. Cl.
*H01S 3/094*   (2006.01)
*H01S 3/067*   (2006.01)
(Continued)

(52) U.S. Cl.
CPC .... *H01S 3/094061* (2013.01); *H01S 3/06754* (2013.01); *H01S 3/0912* (2013.01);
(Continued)

(58) Field of Classification Search
CPC ......... H01S 3/094061; H01S 3/094003; H01S 3/06754; H01S 3/06766

See application file for complete search history.

(56) References Cited

U.S. PATENT DOCUMENTS 5,241,414 A    8/1993  Giles et al.
5,991,476 A *  11/1999 Baney ................ H04Q 11/0005
                                               385/16
(Continued)

FOREIGN PATENT DOCUMENTS

CN    108141283 A    6/2018
EP     0910140 A2   4/1999
(Continued)

OTHER PUBLICATIONS

International Search Report for PCT Application No. PCT/JP2020/002070, mailed on Mar. 24, 2020.
(Continued)

*Primary Examiner* — Eric L Bolda

(57) ABSTRACT

To limit the number of excitation laser diodes (LDs) in an optical amplification device provided with a redundant excitation LD configuration, the optical amplification device is provided with: an excitation unit which outputs a plurality of excitation lights generated by a plurality of excitation light sources; a first distributing unit of which inputs are connected to the plurality of excitation light sources and which branches input lights and then outputs branched lights as a plurality of first distributed lights; a plurality of second distributing units of which inputs are connected to the first distributing unit and which combines and branches input lights and then outputs branched lights as a plurality of second distributed lights; and a plurality of gain mediums which are respectively excited by the plurality of second distributed lights.

17 Claims, 9 Drawing Sheets

(51) Int. Cl.
  *H01S 3/091*   (2006.01)
  *H01S 3/0941*  (2006.01)
  *H01S 3/23*    (2006.01)
  *H04B 10/27*   (2013.01)
  *H01S 3/16*    (2006.01)

(52) U.S. Cl.
  CPC ........ *H01S 3/09415* (2013.01); *H01S 3/2383* (2013.01); *H01S 3/06708* (2013.01); *H01S 3/1608* (2013.01); *H04B 10/27* (2013.01)

(56) References Cited

U.S. PATENT DOCUMENTS

| | | | |
|---|---|---|---|
| 6,839,163 B1* | 1/2005 | Jakobson | H01S 3/06704 359/341.1 |
| 2002/0122244 A1 | 9/2002 | Sotgiu et al. | |
| 2002/0154355 A1 | 10/2002 | Payne et al. | |
| 2002/0154390 A1* | 10/2002 | Shieh | H01S 3/094061 359/341.33 |
| 2003/0039027 A1* | 2/2003 | Welch | H01S 3/2383 359/341.3 |
| 2004/0207912 A1* | 10/2004 | Nagel | H01S 3/094003 359/341.3 |
| 2019/0052390 A1 | 2/2019 | Mikami | |
| 2019/0280452 A1* | 9/2019 | Inada | H01S 3/091 |
| 2019/0348812 A1 | 11/2019 | Kawai | |
| 2021/0028591 A1* | 1/2021 | Xu | H01S 3/094061 |
| 2021/0044075 A1* | 2/2021 | Mikami | H01S 3/2308 |
| 2021/0384978 A1* | 12/2021 | Kawai | H04B 10/25891 |

FOREIGN PATENT DOCUMENTS

| | | |
|---|---|---|
| EP | 3358761 A1 | 8/2018 |
| JP | 2014-160908 A | 9/2014 |
| WO | 2017/056438 A1 | 4/2017 |
| WO | 2018/097074 A1 | 5/2018 |
| WO | 2018/097281 A1 | 5/2018 |

OTHER PUBLICATIONS

English translation of Written opinion for PCT Application No. PCT/JP2020/002070, mailed on Mar. 24, 2020.

Extended European Search Report for EP Application No. 20749585.4 dated on Mar. 7, 2022.

CN Office Action for CN Application No. 202080010012.6, mailed on Nov. 10, 2023 with English Translation.

* cited by examiner

OPTICAL AMPLIFICATION DEVICE AND OPTICAL AMPLIFICATION METHOD

This application is a National Stage Entry of PCT/JP2020/002070 filed on Jan. 22, 2020, which claims priority from Japanese Patent Application 2019-014765 filed on Jan. 30, 2019, the contents of all of which are incorporated herein by reference, in their entirety.

TECHNICAL FIELD

The present invention relates to an optical amplification device and an optical amplification method, and more particularly, to an optical amplification device and an optical amplification method that have a redundant configuration of an excitation light source.

BACKGROUND ART

FIG. 8 is a diagram illustrating a configuration of a general optical amplification device 900 being used in a submarine cable system. The optical amplification device 900 is provided in a submarine repeater of the submarine cable system. In order to ensure high reliability required for the submarine repeater, a redundant configuration including four excitation LDs 901 to 904 (LD 1 to LD 4) is employed. The LD means a laser diode. Beams of excitation light generated by the excitation LDs 901 to 904 are coupled by an optical coupler 905 in a preceding stage. Split excitation light excites erbium-doped fibers (EDFs) 909 and 910 arranged in a middle of each of optical fibers 907 and 908 via an optical coupler 906 in a subsequent stage. The EDFs 909 and 910 are gain media to be generally used in an optical amplification device of 1550 nm band.

Intensity of the excitation light generated by the excitation LDs 901 to 904 is controlled by a control circuit 920. Such a configuration in which a redundant function of excitation light source is achieved by four excitation LDs is hereinafter referred to as a "4-LDs redundant configuration".

In general, one optical fiber is assigned to each of optical fiber transmission lines of the submarine cable system for transmission in an upstream direction and transmission in a downstream direction. A pair of optical fibers in the upstream direction and the downstream direction is called a fiber pair (FP). Assuming that the optical fiber 907 is used for transmission in the upstream direction (Up) and the optical fiber 908 is used for transmission in the downstream direction (Down), the optical amplification device 900 amplifies an optical signal of one fiber pair (FP).

When the number of optical fibers connected to an optical repeater increases from one fiber pair (1 FP) to two fiber pairs (2 FPs), the number of EDFs requiring excitation also increases from two to four. In order to excite four EDFs by using the optical amplification device 900 in the configuration of FIG. 8, two optical amplification devices 900 are required. In this case, eight excitation LDs are required. Further, when the number of optical fibers is increased to four fiber pairs (4 FPs), 16 excitation LDs are required to excite eight EDFs.

FIG. 9 is a diagram illustrating a configuration of another general optical amplification device 910. The optical amplification device 910 includes an excitation unit 911 having a control circuit 920 and four excitation LDs 901 to 904 (LD 1 to LD 4), and an optical amplification unit 921 having optical couplers 931 to 934 and EDFs 941 to 944. The optical amplification unit 921 excites the four EDFs 941 to 944 included in two fiber pairs by the 4-LDs redundant configuration using the excitation LDs 901 to 904. Therefore, the optical amplification unit 921 needs to include four input ports for inputting excitation light.

The optical amplification unit 921 includes four optical couplers 931 to 934 for distributing input four beams of excitation light to four EDFs. The optical coupler 931 couples the beams of excitation light generated by the excitation LDs 901 and 902, and outputs the beams of coupled excitation light to the optical couplers 933 and 934. The optical coupler 932 couples the beams of excitation light generated by the excitation LDs 903 and 904, and outputs the beams of coupled excitation light to the optical couplers 933 and 934. The optical coupler 933 couples and splits the beams of excitation light being input from the optical couplers 931 and 932, and excites the EDFs 941 and 942. The optical coupler 934 couples and splits the beams of excitation light being input from the optical couplers 931 and 932, and excites the EDFs 943 and 944.

By using the optical couplers 931 to 934, the beams of excitation light generated by the excitation LDs 921 to 924 excite all of the EDFs 941 to 944. In this manner, the optical amplification device 910 can excite four EDFs by the 4-LDs redundant configuration, and the number of excitation LDs required for one EDF can be reduced by half as compared with the optical amplification device 900 in FIG. 8.

In FIG. 9, when four optical fiber transmission lines (FP 3 and FP 4) are further increased, another set of optical amplification device having a similar configuration to that of the optical amplification device 910 needs to be prepared, as indicated by a broken line. The four EDFs of FP 1 and FP 2 are then excited by using four excitation LDs (LD 1 to LD 4), and the four EDFs of the FP 3 and the FP 4 are excited by using other excitation LDs (LD 5 to LD 8). When the configuration of FIG. 8 is extended to four fiber pairs, 16 excitation LDs are required, whereas in the configuration of FIG. 9, eight excitation LDs (LD 1 to LD 8) are required, and the number of excitation LDs can be reduced by half as compared with FIG. 8.

In connection with the present invention, PTL 1 describes an optical signal repeater in which either one of two types of optical fiber amplifiers or a through fiber is selected in response to a failure state of an excitation LD in a redundant configuration of two excitation LDs.

CITATION LIST

Patent Literature

[PTL 1] Japanese Unexamined Patent Application Publication No. 2014-160908

SUMMARY OF INVENTION

Technical Problem

In the optical amplification device 900 described with reference to FIG. 8, since four excitation LDs and two EDFs are integrated, relationship between the number of excitation LDs and the number of EDFs cannot be changed. In the optical amplification device 910 described with reference to FIG. 9, it is necessary to match the number (four) of the excitation LDs of the excitation unit 911 with the number (four) of the input ports for excitation light of the optical amplification unit 921. As a result, in an optical amplification device using a general 4-LDs redundant configuration, more than four EDFs cannot be excited by using four excitation LDs. Further, the configuration described in PTL 1 does not describe a technique for solving the problem of suppressing an increase in the number of excitation LDs for one EDF in an optical amplification device having a 4-LDs redundant configuration.

Object of Invention

An object of the present invention is to provide a technique being able to suppress the number of excitation LDs in an optical amplification device having a redundant configuration of an excitation LD.

Solution to Problem

An optical amplification device according to the present invention includes:
an excitation means for outputting a plurality of beams of excitation light generated by a plurality of excitation light sources;
a first distribution means for connecting input to the plurality of excitation light sources, splitting input light, and outputting split light as a plurality of beams of first distribution light;
a plurality of second distribution means for connecting input to the first distribution means, coupling and splitting input light, and outputting split light as a plurality of beams of second distribution light; and
a plurality of gain media being excited by each of the plurality of beams of second distribution light.

An optical amplification method according to the present invention includes:
outputting a plurality of beams of excitation light generated by a plurality of excitation light sources;
splitting light being input from the plurality of excitation light sources, and outputting split light as a plurality of beams of first distribution light;
coupling and splitting the first distribution light, and outputting split light as a plurality of beams of second distribution light; and
exciting a plurality of gain media by each of the plurality of beams of second distribution light.

Advantageous Effects of Invention

The present invention is able to suppress the number of excitation LDs in an optical amplification device having a redundant configuration of an excitation LD.

EXAMPLE EMBODIMENT

First Example Embodiment

Figure 1:
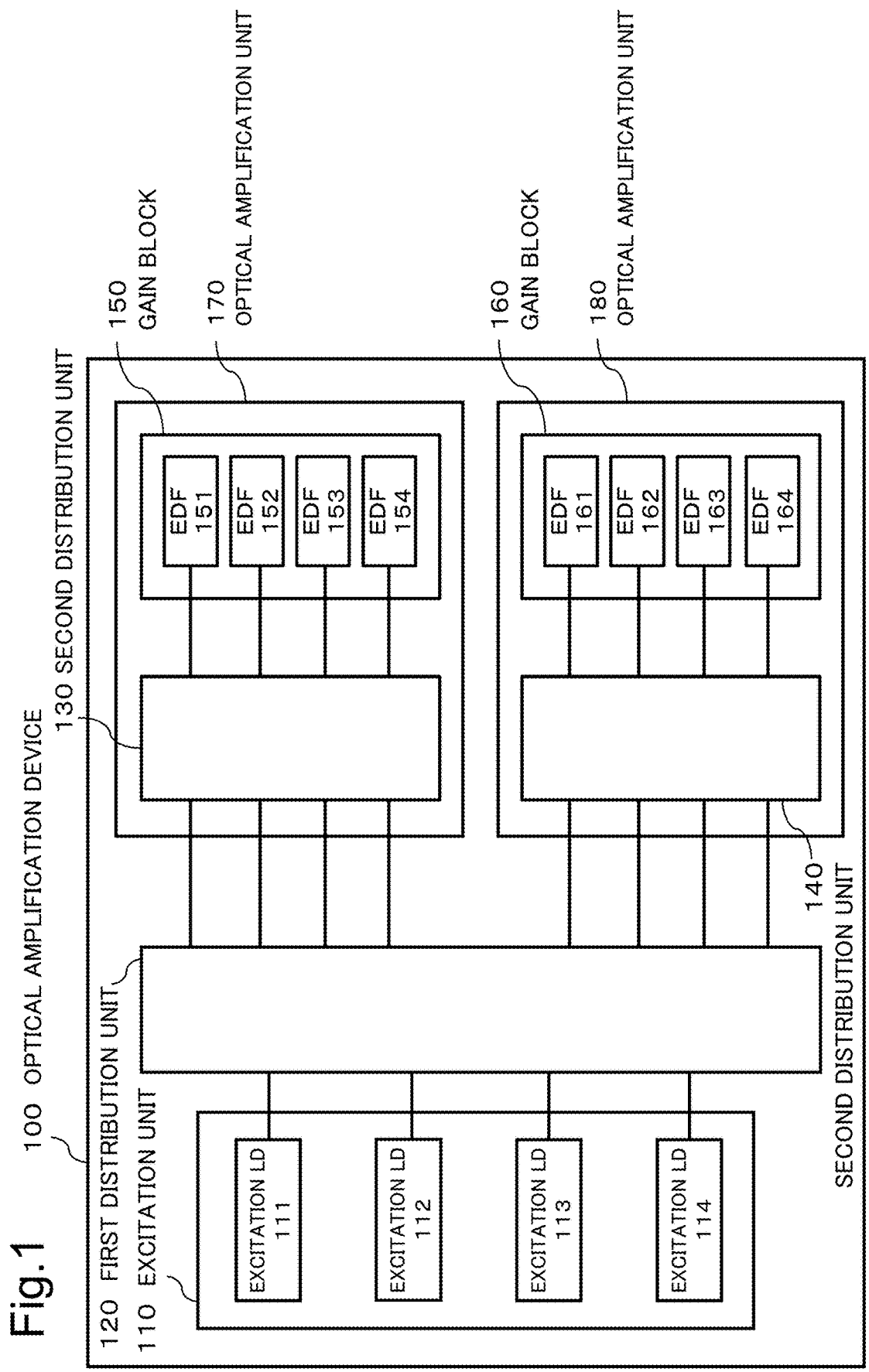
FIG. 1 is a block diagram illustrating a configuration example of an optical amplification device 100.

FIG. 1 is a block diagram illustrating a configuration example of an optical amplification device 100 according to the present invention. The optical amplification device 100 includes an excitation unit 110, a first distribution unit 120, and optical amplification units 170 and 180. The optical amplification unit 170 includes a second distribution unit 130 and a gain block 150. The optical amplification unit 180 includes a second distribution unit 140 and a gain block 160.

The excitation unit 110 includes excitation LDs 111 to 114 for outputting excitation light. The excitation LDs 111 to 114 are excitation light sources that generate excitation light that excites the gain blocks 150 and 160. In other words, the excitation unit 110 has an excitation means for outputting a plurality of beams of excitation light. The first distribution unit 120 splits beams of excitation light being input from the excitation LDs 111 to 114, and outputs a larger number of beams of excitation light (first distribution light) than the number of excitation LDs. In other words, the first distribution unit 120 has a first distribution means for splitting input light and outputting the split light as a plurality of beams of first distribution light. The second distribution units 130 and 140 couple and split the first distribution light being input from the first distribution unit, and output the split light (second distribution light). In other words, the second distribution units 130 and 140 have a second distribution means for coupling and splitting input light and outputting the split light as a plurality of beams of second distribution light.

The gain blocks 150 and 160 include EDFs 151 to 154 and EDFs 161 to 164, respectively. Each of the plurality of beams of second split light being input to the gain blocks 150 and 160 excites the EDFs 151 to 154 and the EDFs 161 to 164. The EDFs 151 to 154 and EDFs 161 to 164 are gain media for amplifying light. The EDFs 151 to 154 and the EDFs 161 to 164 excited by the second excitation light amplify an input optical signal. Since a basic configuration of an optical amplifier using an EDF is widely known, a description of input and output paths of optical signals amplified by the EDFs 151 to 154 and the EDFs 161 to 164 is omitted in the gain blocks 150 and 160 in FIG. 1.

The first distribution unit 120 splits the excitation light, and thereby outputs a larger number of beams of excitation light (first distribution light) than the number of excitation LDs to the second distribution units 130 and 140. For example, the first distribution unit 120 included in the optical amplification device 100 distributes four beams of input excitation light into eight beams of excitation light, and outputs the eight beams of excitation light. Each of the second distribution units 130 and 140 couples and splits the four beams of input excitation light, and generates and outputs four beams of excitation light.

The optical amplification device 100 having such a configuration has a redundant configuration including a plurality of excitation LDs, and can excite more EDFs than the number of excitation LDs. For example, the optical amplification device 100 can excite eight EDFs by providing a redundant configuration (4-LDs redundant configuration) including four excitation LDs. In other words, the optical amplification device 100 can suppress the number of excitation LDs in an optical amplification device having the redundant configuration of the excitation LDs. By providing such a redundant configuration, the optical amplification device 100 can maintain an amplification function of the optical amplification device by excitation light of another excitation LD even when one excitation LD is deteriorated.

Second Example Embodiment

Figure 2:
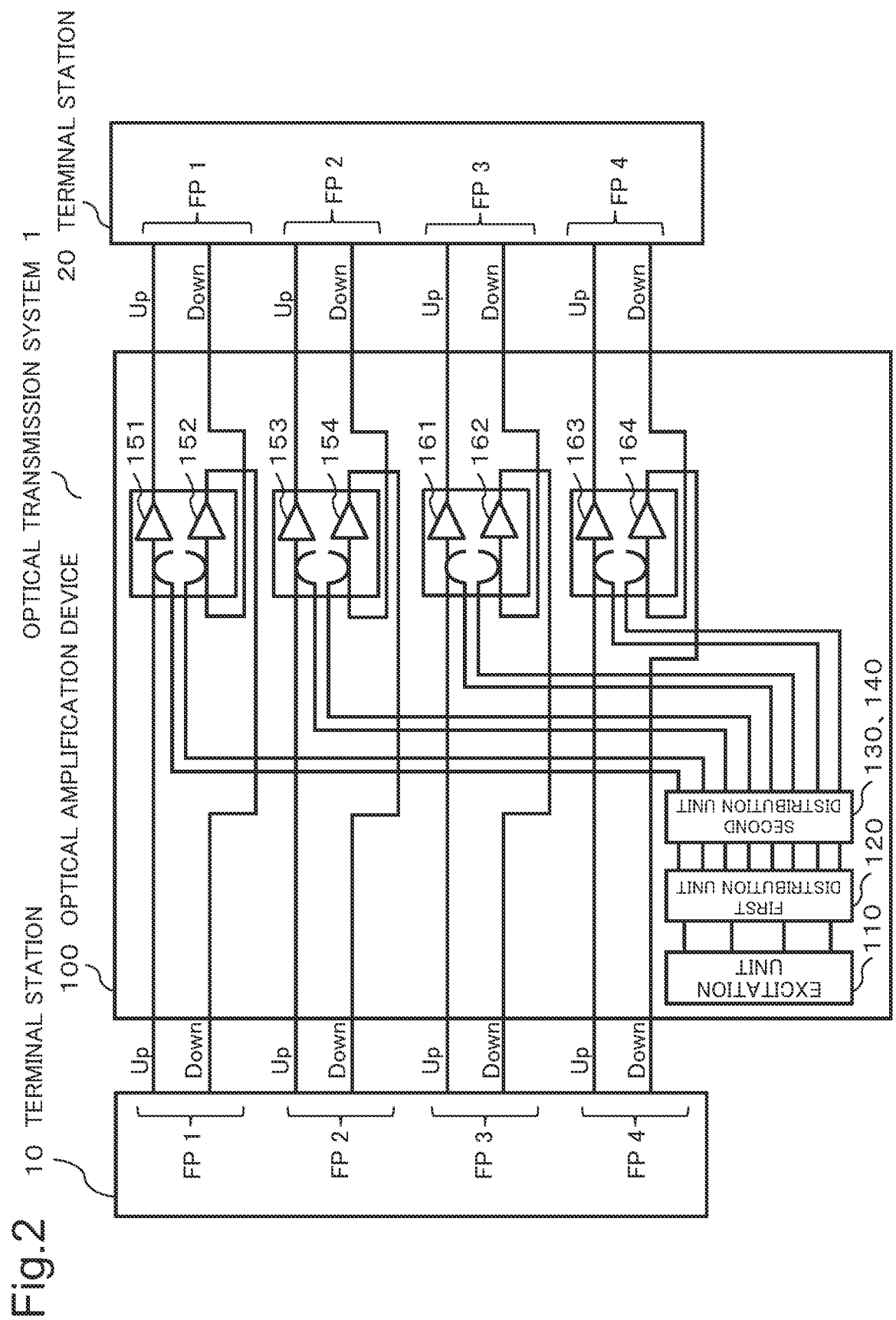
FIG. 2 is a block diagram illustrating a configuration example of an optical transmission system 1.

FIG. 2 is a block diagram illustrating a configuration example of an optical transmission system 1 according to a second example embodiment of the present invention. In the present example embodiment and the subsequent example embodiments, the same reference signs are assigned to the already-mentioned elements, and a repetitive description thereof is omitted.

The optical transmission system 1 includes a terminal station 10, a terminal station 20, and an optical amplification device 100. The terminal stations 10 and 20 are optical transceivers that transmit and receive an optical signal, to which four fiber pairs FP 1 to FP 4 are connected. The terminal station 10 and the terminal station 20 are connected to each other by an optical fiber transmission line including the FP 1 to the FP 4. Each fiber pair includes an upstream line (Up) and a downstream line (Down). The optical amplification device 100 amplifies an upstream optical signal being input from the terminal station 10, and outputs the amplified signal to the terminal station 20. The optical amplification device 100 also amplifies a downstream optical signal being input from the terminal station 20, and outputs the amplified signal to the terminal station 10.

As described in the first example embodiment, the optical amplification device 100 includes an excitation unit 110, a first distribution unit 120, second distribution units 130 and 140, EDFs 151 to 154, and EDFs 161 to 164. In FIG. 2, the second distribution units 130 and 140 are illustrated as one block. The EDFs 151 to 154 and the EDFs 161 to 164 in FIG. 2 constitute a gain block 150 and a gain block 160 in FIG. 1, respectively.

Four beams of excitation light generated by the excitation unit 110 are distributed to eight beams of excitation light by the first distribution unit 120 and the second distribution units 130 and 140. A configuration and a procedure for the distribution are similar to those of the first example embodiment. Each of the eight beams of excitation light being output from the second distribution units 130 and 140 excites the EDFs 151 to 154 and the EDFs 161 to 164. The EDF 151 amplifies an upstream optical signal propagating through the FP 1, and the EDF 152 amplifies a downstream optical signal propagating through the FP 1. Similarly, the EDFs 153 and 154 amplify an optical signal propagating through the FP 2. Furthermore, the EDFs 161 and 162 amplify an optical signal propagating through the FP 3, and the EDFs 163 and 164 amplify an optical signal propagating through the FP 4.

Figure 3:
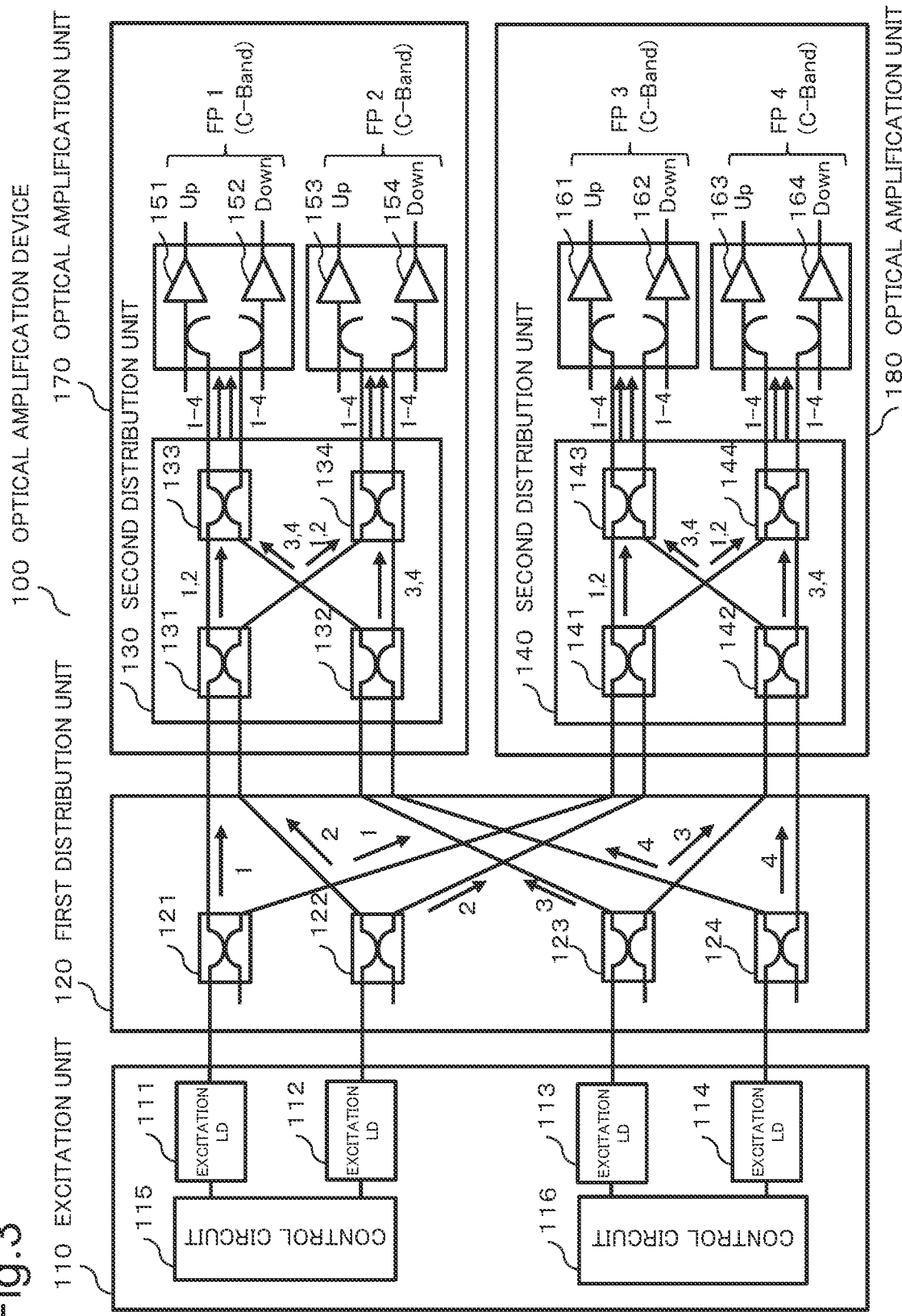
FIG. 3 is a block diagram illustrating a detailed configuration example of the optical amplification device 100.

FIG. 3 is a block diagram illustrating a detailed configuration example of the optical amplification device 100 according to the present example embodiment. The excitation unit 110 includes four excitation LDs 111 to 114 and control circuits 115 and 116 that control an optical output of the excitation LDs 111 to 114. FIG. 3 illustrates an example in which each of the control circuits 115 and 116 controls two excitation LDs. However, the number of excitation LDs controlled by one control circuit is not limited. For example, one control circuit may control all excitation LDs. In the drawings of and after FIG. 3, an arrow exemplifies a direction of a signal, and a direction of the signal is not limited.

The control circuits 115 and 116 control power of excitation light generated by each of the excitation LDs 111 to 114 in such a way that the excitation light of predetermined power is supplied to the EDFs 151 to 154 and the EDFs 161 to 164. The power of the excitation light generated by the excitation LDs 111 to 114 is controlled by a drive current of each excitation LD. The control circuits 115 and 116 may detect output power of the excitation LD, based on a photocurrent of a monitor photodetector included in each excitation LD. Further, the control circuits 115 and 116 may store, in advance, a transmission loss for each optical path of the excitation light passing through the first distribution unit 120 and the second distribution units 130 and 140. For example, by considering a loss of an optical path from the excitation unit 110 of the excitation LDs 111 and 112 to each EDF, the control circuit 115 can estimate excitation light power being supplied to each EDF and based on the excitation LDs 111 and 112.

The control circuits 115 and 116 may be communicably connected to each other, and one control circuit may control any excitation LD, based on information acquired from the other control circuit. For example, the control circuit 115 may communicate with the control circuit 116 and acquire an operation state of the excitation LDs 113 and 114, and adjust power of the excitation light of the excitation LDs 111 to 114 in response to the state.

With an increase in output of the excitation LD in recent years, optical power being able to excite five or more EDFs can be acquired even in the optical amplification device having the 4-LDs redundant configuration. The first distribution unit 120 according to the present example embodiment is a 4×8 optical coupler that distributes four inputs to eight outputs, and is constituted of, for example, four 1×2 optical couplers (optical couplers 121 to 124). Each of the inputs of the first distribution unit 120 is connected to one of the different excitation LDs 111 to 114. The first distribution unit 120 splits the output of each of the four excitation LDs 111 to 114 included in the excitation unit 110 into two, and supplies four beams of the excitation light to each of the second distribution units 130 and 140.

An optical amplification unit 170 includes four excitation light input ports for inputting four beams of excitation light. The optical amplification unit 170 includes four EDFs 151 to 154 for amplifying optical signals (the FP 1 and the FP 2) of two sets of fiber pairs. Specifically, the optical amplification unit 170 includes the second distribution unit 130 and the EDFs 151 to 154.

Each of the four excitation light input ports of the second distribution unit 130 is connected to a different output of the first distribution unit 120. The second distribution unit 130 couples four beams of excitation light being input from the first distribution unit 120, splits the coupled excitation light, and distributes the split excitation light to the four EDFs 151 to 154. In the present example embodiment, the second distribution unit 130 is constituted of a 4×4 optical coupler by four 2×2 optical couplers (optical couplers 131 to 134).

In FIG. 3, fiber pairs through which optical signals amplified by each of the EDFs propagate are illustrated as the FP 1 to the FP 4. A configuration of an optical amplification unit 180 including the second distribution unit 140 and the EDFs 161 to 164 is similar to that of the optical amplification unit 170, and different in a point that fiber pairs through which optical signals propagate are the FP 3 and the FP 4. Each of the EDFs 151 to 154 and EDFs 161 to 164 amplifies a C-band optical signal. As used herein, "C-band" indicates a wavelength band ranging generally from 1530 nm to 1565 nm.

An operation of the optical amplification device 100 according to the present example embodiment is described in more detail. Four beams of excitation light generated by the excitation unit 110 are distributed to eight beams of excitation light by the optical couplers 121 to 124 included in the first distribution unit 120. Four beams of the distributed excitation light are supplied to the optical amplification unit 170, and the remaining four beams of the distributed light are supplied to the optical amplification unit 180. More specifically, one of beams of the excitation light split by the optical couplers 121 to 124 into two beams of light is output to the second distribution unit 130, and the other is output to the second distribution unit 140. As a result, the four beams of excitation light supplied to the optical amplification unit 170 include the beams of excitation light generated by the excitation LDs 111 to 114. The four beams of excitation light supplied to the optical amplification unit 180 also include the beams of excitation light generated by the excitation LDs 111 to 114. In other words, the four beams of excitation light generated by the excitation LDs 111 to 114 are input to both the second distribution unit 130 and the second distribution unit 140.

Each of the optical couplers 131 to 134 included in the second distribution unit 130 couples two beams of input excitation light, splits each of the beams of coupled excitation light into two beams of light, and output each of the beams of split excitation light to the EDFs 151 to 154 as second distribution light. More specifically, the four beams of excitation light being input to the second distribution unit 130 are coupled in the optical coupler 131 or 132 and then split, and are output to the optical couplers 133 and 134. As a result, the excitation light generated by the excitation LDs 111 to 114 is input to the optical couplers 133 and 134. The optical couplers 133 and 134 couple the beams of excitation light being output from the optical couplers 131 and 132, and then split the coupled excitation light. The optical coupler 133 supplies excitation light to the EDFs 151 and 152. The optical coupler 134 supplies excitation light to the EDFs 153 and 154.

Similarly, the four beams of excitation light being input to the second distribution unit 140 are coupled in the optical coupler 141 or 142 and then split, and are output to the optical couplers 143 and 144. As a result, the excitation light generated by the excitation LDs 111 to 114 is also input to the optical couplers 143 and 144. The optical coupler 143 supplies excitation light to the EDFs 161 and 162. The optical coupler 144 supplies excitation light to the EDFs 163 and 164.

With such a configuration, each of the EDFs 151 to 154 and the EDFs 161 to 164 is excited by the excitation light generated by the excitation LDs 111 to 114. When power of the excitation light of any of the excitation LDs 111 to 114 fluctuates, the control circuits 115 and 116 may maintain the power of the excitation light supplied to the EDF within a predetermined range by controlling output power of other excitation LDs in such a way as to compensate for the fluctuation. For example, when power of the excitation light of the excitation LD 111 decreases, the control circuit 115 may suppress a decrease in the power of the excitation light being output from the second distribution units 130 and 140 by increasing a drive current of the excitation LD 112. In a case where one control circuit 115 controls the excitation LDs 111 to 114, the control circuit 115 may compensate for a decrease in power of the failed excitation LD by increasing output power of a plurality of normal excitation LDs. The control circuits 115 and 116 may adjust the drive current of the excitation LD in consideration of difference between a loss of an optical path from the excitation unit 110 of the excitation LD whose output power fluctuates to each EDF and a loss of an optical path from the excitation unit 110 of other excitation LD to each EDF. As a result, it is possible to more precisely suppress fluctuation of power of the excitation light supplied to the EDFs 151 to 154 and EDFs 161 to 164.

As described above, the optical amplification device 100 can excite eight EDFs 151 to 154 and EDFs 161 to 164 in the optical amplification device 100 having a redundant configuration (4-LDs redundant configuration) using four excitation LDs 111 to 114. Specifically, the optical amplification device 100 having the 4-LDs redundant configuration can suppress an increase in the number of excitation LDs due to an increase in EDF. In other words, the optical amplification device 100 can suppress the number of excitation LDs of an optical amplification device having the redundant configuration of the excitation LDs.

The first distribution unit 120 is configured to be separable from the excitation unit 110 and the second distribution unit 130. Therefore, in the optical amplification device 100, by inserting the first distribution unit 120 between the excitation unit 110 and the optical amplification unit 170, the optical amplification unit 180 can be added while maintaining the 4-LDs redundant configuration without adding an excitation LD. An optical amplification device needs to mount an EDF associated with a wavelength band of an optical signal transmitted by an optical transmission system, as a gain block. In the present example embodiment, since the first distribution unit 120 and the second distribution units 130 and 140 are configured to be separable from each other, only the optical amplification unit 170 or 180 mounting the EDF 151 to 154 or the EDF 161 to 164 can be changed depending on a configuration of the optical transmission system 1. Thus, for example, without designing a detailed configuration of the optical amplification device 100 for each system, it is possible to achieve an optical amplification device in association with a wavelength to be transmitted in the system by a simple design change. In the following modification example, an example in which the optical amplification units 170 and 180 are replaced with optical amplification units 171 and 181 or optical amplification units 172 and 182 having configurations different from those described above is described.

First Modification Example of Second Example Embodiment

Figure 4:
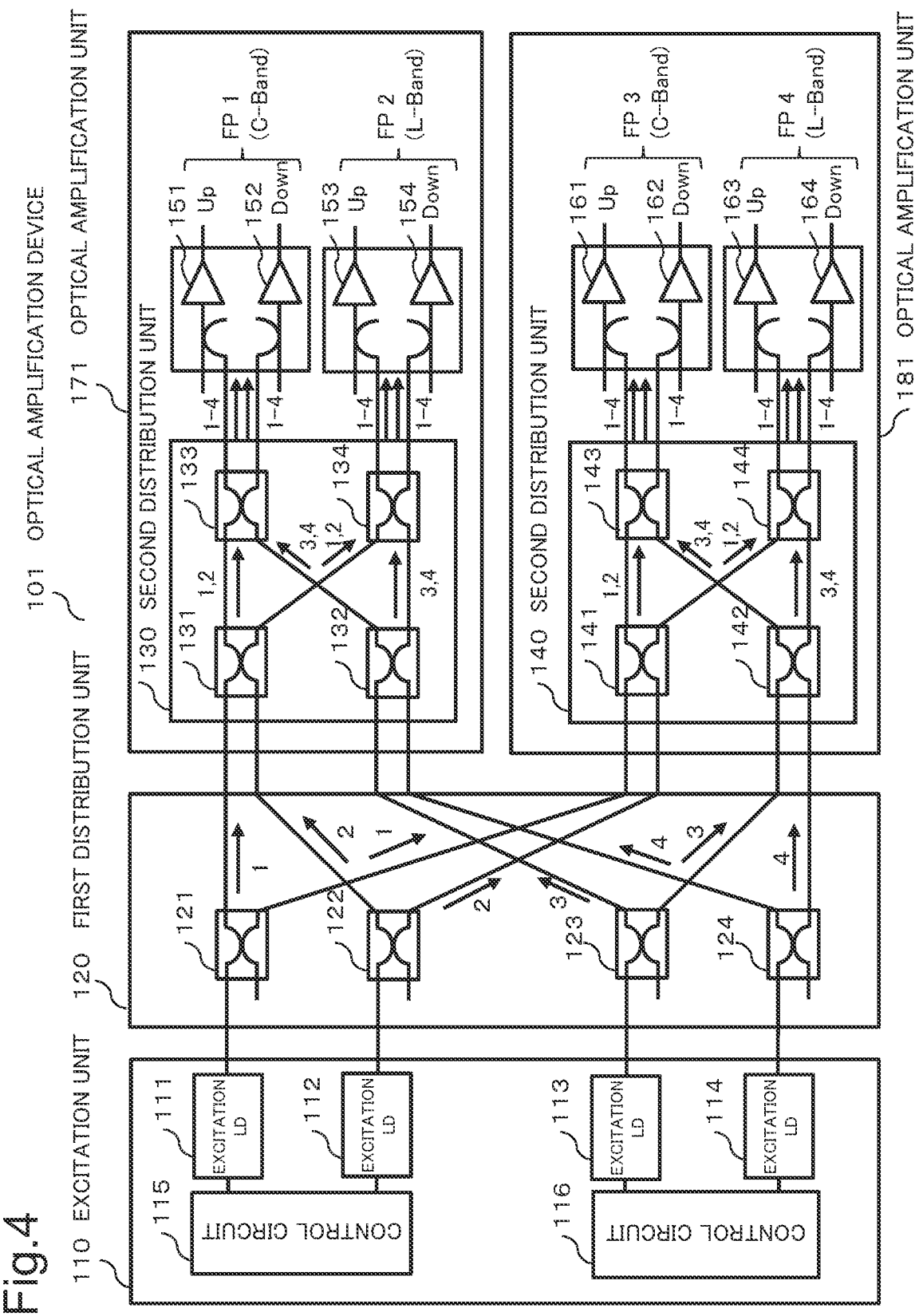
FIG. 4 is a block diagram illustrating a detailed configuration example of an optical amplification device 101.

By changing the optical amplification units 170 and 180, various optical amplification devices with high reliability by the 4-LDs redundant configuration can be achieved. FIG. 4 is a block diagram illustrating a detailed configuration example of an optical amplification device 101 according to a first modification example of the second example embodiment.

The optical amplification device 101 in FIG. 4 includes optical amplification units 171 and 181 instead of the optical amplification units 170 and 180. In the optical amplification device 101, FP 1 and FP 3 transmit C-band optical signals, and FP 2 and FP 4 transmit L-band optical signals. As used herein, "L-band" indicates a wavelength band ranging generally from 1570 nm to 1610 nm. The EDFs 153 and 154 of the FP 2 and the EDFs 163 and 164 of the FP 4 may be the same EDF as the optical amplification device 100, or may be EDFs designed for L-band. In other words, even when a wavelength of an optical signal is different for each fiber pair, the optical amplification device 101 can suppress the number of excitation LDs of an optical amplification device having the redundant configuration of the excitation LDs.

Second Modification Example of Second Example Embodiment

Figure 5:
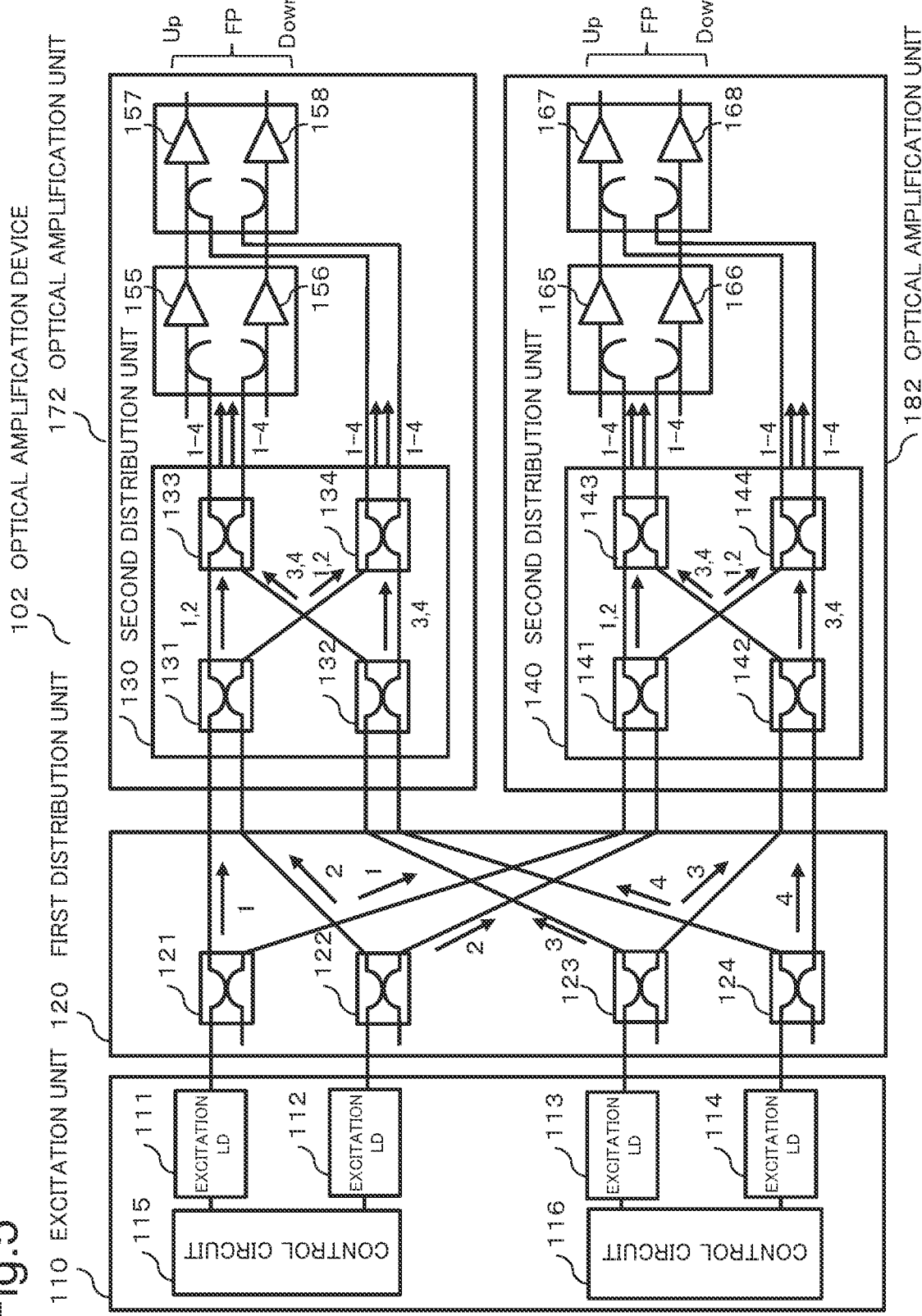
FIG. 5 is a block diagram illustrating a detailed configuration example of an optical amplification device 102.

FIG. 5 is a block diagram illustrating a detailed configuration example of an optical amplification device 102 according to a second modification example of the second example embodiment.

The optical amplification device 102 in FIG. 5 includes optical amplification units 172 and 182. The optical amplification device 102 differs, as compared with the optical amplification devices 100 and 101 in FIGS. 3 and 4, in a point that two EDFs (e.g., EDF 155 and EDF 157) are connected in series and the fiber pairs are only FP 1 and FP 2. In the optical amplification unit 172, the EDFs 155 and 157 amplify an upstream optical signal of the FP 1, and EDFs 156 and 158 amplify a downstream optical signal of the FP 1. In the optical amplification unit 182, EDFs 165 and 167 amplify an upstream optical signal of the FP 2, and EDFs 166 and 168 amplify a downstream optical signal of the FP 2. A wavelength band of the optical signals propagating through the FP 1 and the FP 2 may be C-band or L-band. The optical amplification device 102 can acquire a higher gain than the optical amplification devices 100 and 101 by connecting the EDFs in series, and can suppress the number of excitation LDs of an optical amplification device having the redundant configuration of the excitation LDs.

Third Example Embodiment

Figure 6:
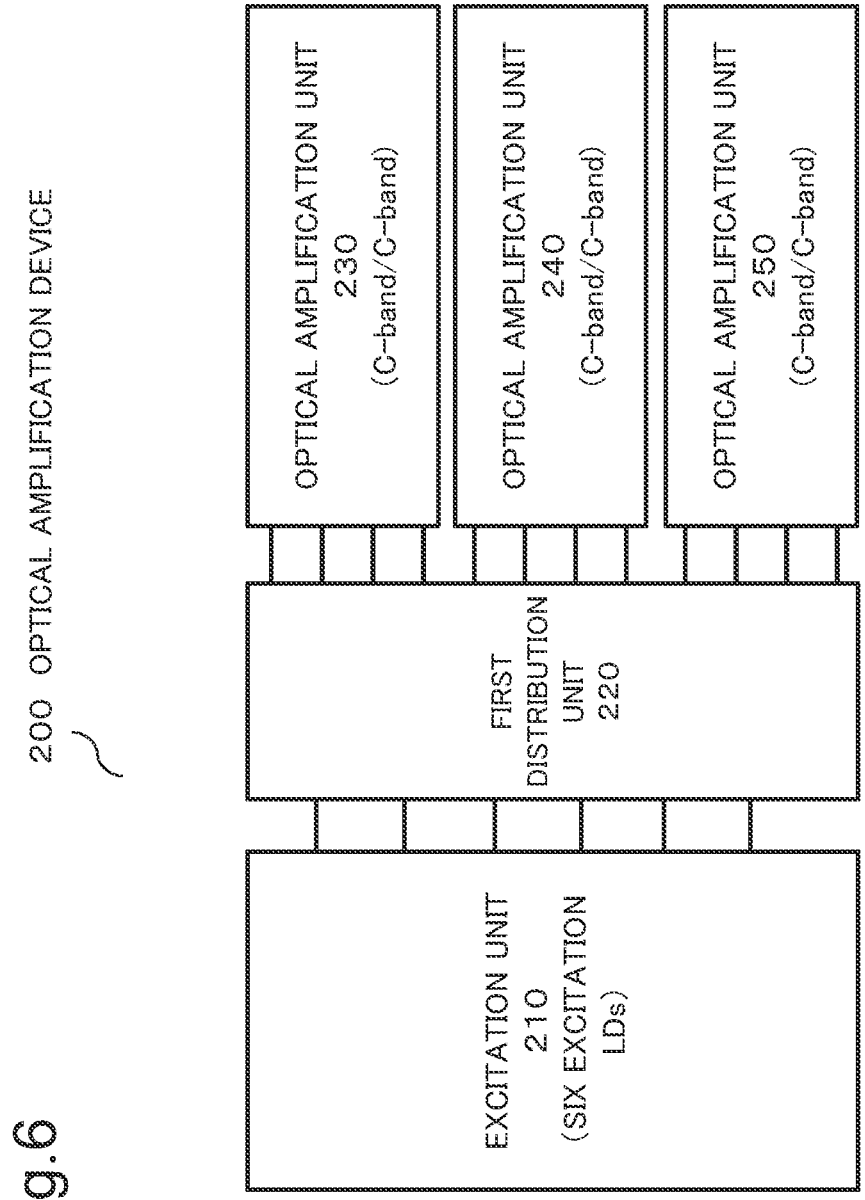
FIG. 6 is a block diagram illustrating a configuration example of an optical amplification device 200.

Description is made on still another configuration example of an optical amplification device that excites a plurality of EDFs by using a plurality of excitation LDs while maintaining high reliability by a redundant configuration of the excitation LDs. FIG. 6 is a block diagram illustrating a configuration example of an optical amplification device 200 according to a third example embodiment.

The optical amplification device 200 includes an excitation unit 210, a first distribution unit 220, and optical amplification units 230, 240, and 250. The excitation unit 210 outputs six beams of excitation light. The first distribution unit 220 splits the six beams of input excitation light, and outputs 12 beams of excitation light. Four beams of excitation light being output from the first distribution unit 220 are supplied to each of the optical amplification units 230 to 250.

Figure 7:
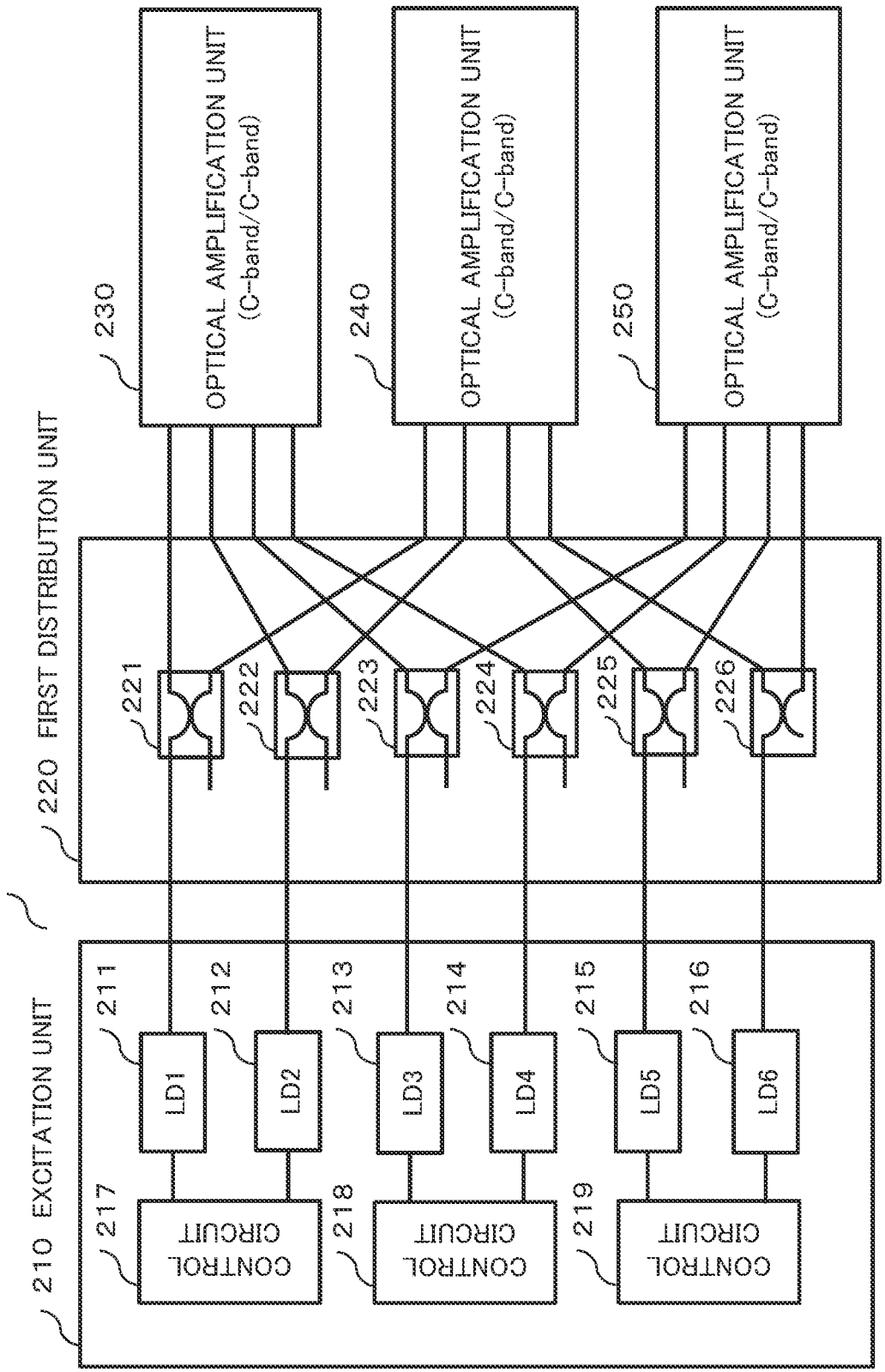
FIG. 7 is a block diagram illustrating a detailed configuration example of the optical amplification device 200.
Figure 8:
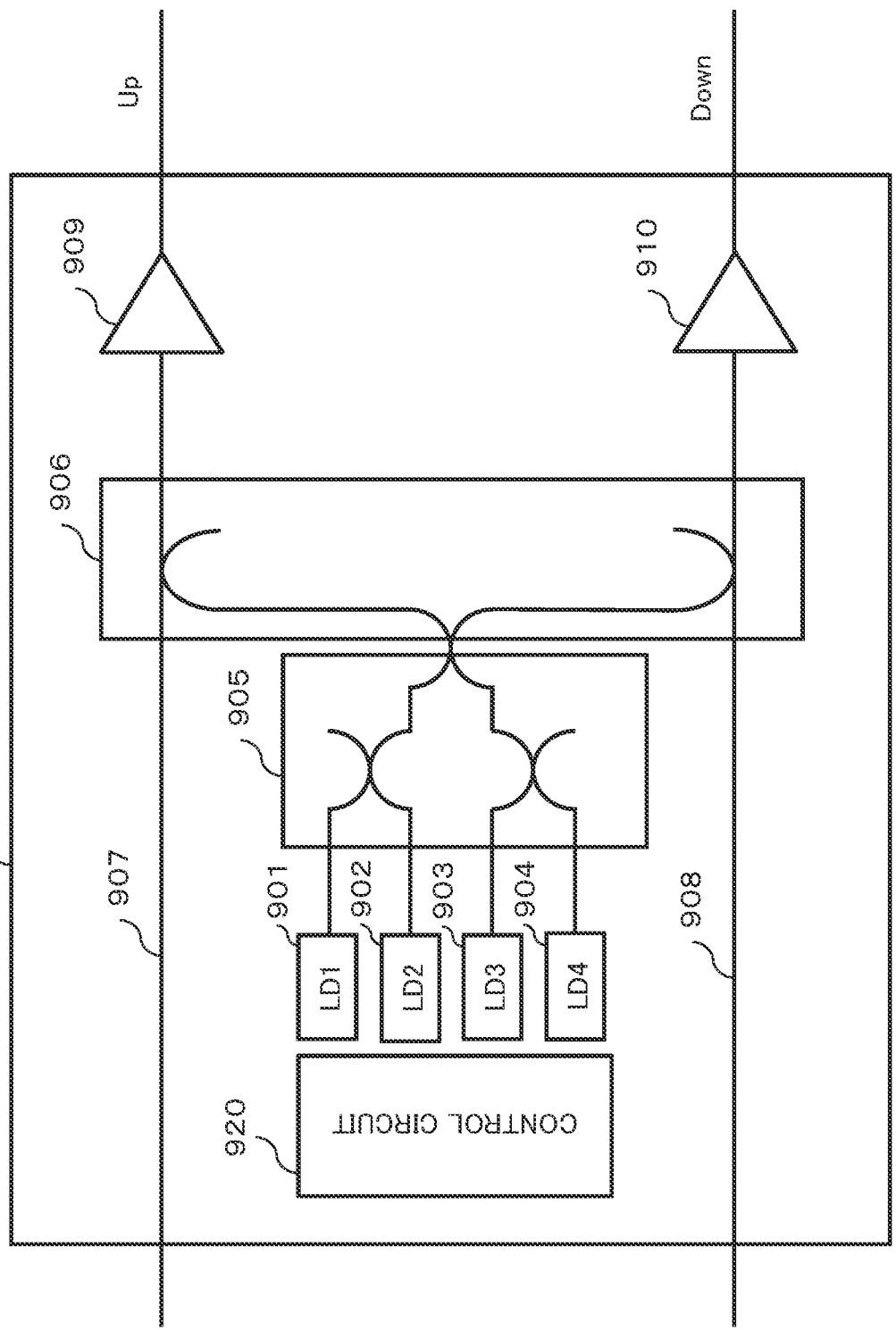
FIG. 8 is a diagram illustrating a configuration of a general optical amplification device 900.
Figure 9:
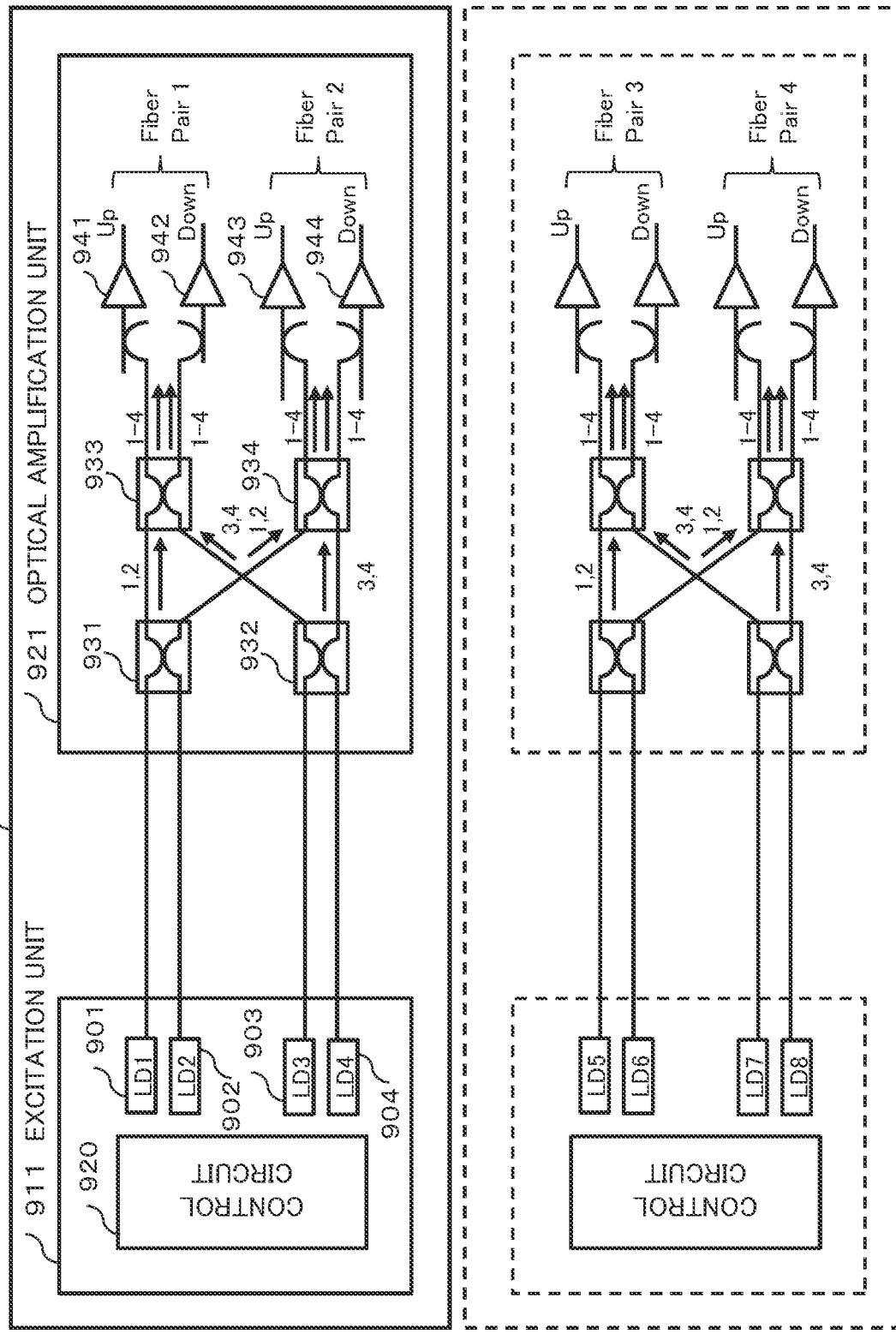
FIG. 9 is a diagram illustrating a configuration of a general optical amplification device 910.

FIG. 7 is a block diagram illustrating a detailed configuration example of the optical amplification device 200. The excitation unit 210 includes excitation LDs 211 to 216 (LD 1 to LD 6) and control circuits 217 to 219. The control circuit 217 controls the excitation LDs 211 and 212, the control circuit 218 controls the excitation LDs 213 and 214, and the control circuit 219 controls the excitation LDs 215 and 216. However, the number of excitation LDs controlled by a control circuit is not limited. For example, the control circuit 217 may control all of the excitation LDs 211 to 216. The control circuits 217 to 219 are communicably connected to each other, and the control circuits 217 to 219 may control any excitation LD, based on information acquired from other control circuits. For example, the control circuit 217 may adjust power of excitation light of the excitation LDs 211 to 216 in response to a state of the control circuits 218 and 219 and the excitation LDs 213 to 216.

The first distribution unit 220 includes six 1×2 optical couplers (optical couplers 221 to 226). The first distribution unit 220 splits each of the six beams of excitation light being input from the excitation LDs 211 to 216 into two beams of light, and outputs 12 beams of excitation light. The first distribution unit 220 supplies four beams of the excitation light to each of the optical amplification units 230 to 250. FIG. 7 illustrates an example in which the beams of excitation light generated by the excitation LDs 211 to 214 are supplied to the optical amplification unit 230. The beams of excitation light generated by the excitation LDs 211 to 212 and 215 to 216 are supplied to the optical amplification unit 240. The beams of excitation light generated by the excitation LDs 213 to 216 are supplied to the optical amplification unit 250.

The optical amplification units 230 to 250 have a similar configuration to that of the optical amplification unit 170 according to the second example embodiment. Similarly to the second example embodiment, beams of excitation light from the four excitation LDs are input to the optical amplification units 230 to 250. Each of the optical amplification units 230 to 250 amplifies an optical signal of the C-band propagating through two sets of fiber pairs by exciting four EDFs with excitation light coupled and split by the second distribution unit 130. The optical amplification units 230 to 250 split and couple four beams of excitation light by the second distribution unit 130 (4×4 optical coupler) illustrated in FIG. 3. Therefore, the 4-LDs redundant configuration is also achieved in the optical amplification device 200. With such a configuration, the optical amplification device 200 can excite 12 EDFs while maintaining the 4-LDs redundant configuration by using six excitation LDs. In other words, the optical amplification device 200 can also suppress the number of excitation LDs of an optical amplification device having the redundant configuration of the excitation LDs.

Other Representation of Second and Third Example Embodiments

The configuration of the optical amplification device according to the second and third example embodiments can also be described as follows. Specifically, an excitation unit includes 2n excitation light sources (n is an integer of 2 or more), and a first distribution unit outputs 4n beams of first distribution light in response to excitation light being 1 or more beams and 2n or less beams. Each of n second distribution units generate four beams of second distribution light in response to the four beams of first distribution light. The n second distribution units that generate the four beams of second distribution light excite 4n gain media. The second example embodiment and the modification examples thereof are examples in a case of n=2, and the third example embodiment is an example in a case of n=3. In the case of n=3, the 4-LDs redundant configuration is achieved by outputting beams of excitation light of four excitation LDs out of the six excitation LDs from the first distribution unit 220 to the optical amplification units 230 to 250. Even when n is 4 or more, the optical amplification device can excite a greater number of the gain media while maintaining the 4-LDs redundant configuration.

In the drawings of each of the example embodiments described above, an example has been described in which the first distribution units 120 and 220 include a plurality of 1×2 optical couplers, and the second distribution units 130 and 140 include a plurality of 2×2 optical couplers. However, a configuration of the first and second distribution units is not limited to the description in the drawings. For example, a 1×3 optical coupler may be used for the first distribution unit, instead of the 1×2 optical coupler. As a result, the first distribution unit can output more than 4n beams of the first distribution light in response to excitation light being one or more beams and 2n or less beams. Such a configuration may be used when there is a margin in power of the excitation LD, and more EDFs can be excited.

Further, the second distribution unit may couple and split five or more beams of the first distribution light generated by five or more different excitation LDs, and thereby generate the second distribution light. In this case, since a redundant configuration using five or more excitation LDs is achieved, further improvement in reliability is expected. Also, the number of beams of second distribution light being output in response to the number of beams of first distribution light is not limited to the number according to each example embodiment.

Note that, the example embodiments of the present invention may also be described as supplementary notes described below, but the present invention is not limited thereto.

Supplementary Note 1

An optical amplification device including:
an excitation means for outputting a plurality of beams of excitation light generated by a plurality of excitation light sources;
a first distribution means for connecting input to the plurality of excitation light sources, splitting input light, and outputting split light as a plurality of beams of first distribution light;
a plurality of second distribution means for connecting input to the first distribution means, coupling and splitting input light, and outputting split light as a plurality of beams of second distribution light; and
a plurality of gain media being excited by each of the plurality of beams of second distribution light.

Supplementary Note 2

The optical amplification device according to supplementary note 1, wherein each of inputs of the first distribution means is connected to mutually different one of the excitation light sources.

Supplementary Note 3

The optical amplification device according to supplementary note 1 or 2, wherein the first distribution means includes a plurality of first optical couplers for splitting each of beams of input light into two beams of light.

Supplementary Note 4

The optical amplification device according to any one of supplementary notes 1 to 3, wherein each of outputs of the first distribution means is connected to a different input of the different second distribution means.

Supplementary Note 5

The optical amplification device according to any one of supplementary notes 1 to 4, wherein the second distribution means includes
a plurality of second optical couplers that each couple two beams of first distribution light, split each of beams of the coupled first distribution light into two beams of light, and output the split first distribution light as the second distribution light.

Supplementary Note 6

The optical amplification device according to any one of supplementary notes 1 to 5, further including:
the excitation means including 2n of the excitation light sources, n being an integer of 2 or more;
the first distribution means for outputting 4n beams of the first distribution light in response to input from 2n of the excitation means;
n of the second distribution means for generating four beams of the second distribution light in response to four beams of the first distribution light; and
4n gain media.

Supplementary Note 7

The optical amplification device according to any one of supplementary notes 1 to 6, wherein the first distribution means is configured to be separable from the excitation means and the second distribution means.

Supplementary Note 8

The optical amplification device according to any one of supplementary notes 1 to 7, wherein one or more of the gain media for amplifying an optical signal propagating through an optical fiber are arranged in each of the two optical fibers constituting one fiber pair.

Supplementary Note 9

An optical transmission system including:
a first terminal station;
a second terminal station; and
the optical amplification device according to any one of supplementary notes 1 to 8 that is connected to the first terminal station and the second terminal station by an optical fiber, and amplifies an optical signal transmitted and received between the first terminal station and the second terminal station.

Supplementary Note 10

An optical amplification method including:
outputting a plurality of beams of excitation light generated by a plurality of excitation light sources;
splitting light being input from the plurality of excitation light sources, and outputting split light as a plurality of beams of first distribution light;
coupling and splitting the first distribution light, and outputting split light as a plurality of beams of second distribution light; and
exciting a plurality of gain media by each of the plurality of beams of second distribution light.

Supplementary Note 11

The optical amplification method according to supplementary note 10, further including splitting light being input from the excitation light sources different from each other, and outputting split light as the first distribution light.

Supplementary Note 12

The optical amplification method according to supplementary note 10 or 11, further including outputting the first distribution light by splitting each of beams of light being input from the excitation light source into two beams of light.

Supplementary Note 13

The optical amplification method according to any one of supplementary notes 10 to 12, further including coupling and splitting beams of the first distribution light different from each other, and outputting split light as the second distribution light.

Supplementary Note 14

The optical amplification method according to any one of supplementary notes 10 to 13, further including coupling two beams of the first distribution light, splitting each of beams of the coupled first distribution light into two beams of light, and outputting the split first distribution light as the second distribution light.

Supplementary Note 15

The optical amplification method according to any one of supplementary notes 10 to 14, further including:
 outputting 4n beams of the first distribution light in response to the excitation light being one or more beams and 2n or less beams, n being an integer of 2 or more;
 generating four beams of the second distribution light in response to four beams of the first distribution light; and
 exciting 4n gain media by each of beams of the second distribution light.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The configurations described in each of the example embodiments are not necessarily mutually exclusive. The functions and effects of the present invention may be achieved by a configuration in which all or part of the above-described example embodiments are combined.

This application is based upon and claims the benefit of priority from Japanese patent application No. 2019-014765, filed on Jan. 30, 2019, the disclosure of which is incorporated herein in its entirety by reference.

REFERENCE SIGNS LIST

1 Optical transmission system
10, 20 Terminal station
100, 101, 102, 200, 900, 910 Optical amplification device
110, 210, 911 Excitation unit
115, 116, 217 to 219, 920 Control circuit
120, 220 First distribution unit
121 to 124, 131 to 134, 141 to 144 Optical coupler
130, 140 Second distribution unit
150, 160 Gain block
170 to 172, 180, 181, 230 to 250, 921 Optical amplification unit
221 to 226 Optical coupler
905, 906, 931 to 934 Optical coupler
907 to 908 Optical fiber

What is claimed is:
1. An optical amplification device comprising:
 a light source circuit configured to output a plurality of beams of excitation light generated by a plurality of light sources;
 a first multiplexer/demultiplexer circuit configured to connect input to the plurality of light sources, split input light, and output split light as a plurality of beams of first distribution light;
 a plurality of second multiplexer/demultiplexer circuits configured to connect input to the first multiplexer/demultiplexer circuit, couple and split input light, and output split light as a plurality of beams of second distribution light;
 a plurality of gain media being excited by each of the plurality of beams of second distribution light;
 the light source circuit including 2n of the light sources, n being an integer of 2 or more;
 the first multiplexer/demultiplexer circuit for outputting 4n beams of the first distribution light in response to input from 2n of the light source circuit;
 n of the second multiplexer/demultiplexer circuits configured to generate four beams of the second distribution light in response to four beams of the first distribution light; and
 4n gain media.
2. The optical amplification device according to claim 1, wherein each of inputs of the first multiplexer/demultiplexer circuit is connected to mutually different one of the light sources.
3. The optical amplification device according to claim 1, wherein the first multiplexer/demultiplexer circuit includes a plurality of first optical couplers for splitting each of beams of input light into two beams of light.
4. The optical amplification device according to claim 1, wherein each of outputs of the first multiplexer/demultiplexer circuit is connected to a different input of the different second multiplexer/demultiplexer circuit.
5. The optical amplification device according to claim 1, wherein the second multiplexer/demultiplexer circuit includes
 a plurality of second optical couplers that each couple two beams of first distribution light, split each of beams of the coupled first distribution light into two beams of light, and output the split first distribution light as the second distribution light.
6. The optical amplification device according to claim 1, wherein the first multiplexer/demultiplexer circuit is configured to be separable from the light source circuit and the second multiplexer/demultiplexer circuit.
7. The optical amplification device according to claim 1, wherein one or more of the gain media for amplifying an optical signal propagating through an optical fiber are arranged in each of the two optical fibers constituting one fiber pair.
8. An optical transmission system comprising:
 a first terminal station;
 a second terminal station; and
 the optical amplification device according to claim 1 that is connected to the first terminal station and the second terminal station by an optical fiber, and amplifies an optical signal transmitted and received between the first terminal station and the second terminal station.
9. An optical amplification method comprising:
 outputting a plurality of beams of light generated by a plurality of light sources;

splitting light being input from the plurality of light sources, and outputting split light as a plurality of beams of first distribution light;

coupling and splitting the first distribution light, and outputting split light as a plurality of beams of second distribution light;

exciting a plurality of gain media by each of the plurality of beams of second distribution light;

outputting 4n beams of the first distribution light in response to the light being one or more beams and 2n or less beams, n being an integer of 2 or more;

generating four beams of the second distribution light in response to four beams of the first distribution light; and exciting 4n gain media by each of beams of the second distribution light.

10. The optical amplification method according to claim 9, further comprising splitting light being input from the light sources different from each other, and outputting split light as the first distribution light.

11. The optical amplification method according to claim 9, further comprising outputting the first distribution light by splitting each of beams of light being input from the light source into two beams of light.

12. The optical amplification method according to claim 9, further comprising coupling and splitting beams of the first distribution light different from each other, and outputting split light as the second distribution light.

13. The optical amplification method according to claim 9, further comprising coupling two beams of the first distribution light, splitting each of beams of the coupled first distribution light into two beams of light, and outputting the split first distribution light as the second distribution light.

14. The optical amplification device according to claim 2, wherein the first multiplexer/demultiplexer circuit includes a plurality of first optical couplers for splitting each of beams of input light into two beams of light.

15. The optical amplification device according to claim 2, wherein each of outputs of the first multiplexer/demultiplexer circuit is connected to a different input of the different second multiplexer/demultiplexer circuit.

16. The optical amplification device according to claim 2, wherein the second multiplexer/demultiplexer circuit includes
a plurality of second optical couplers that each couple two beams of first distribution light, split each of beams of the coupled first distribution light into two beams of light, and output the split first distribution light as the second distribution light.

17. The optical amplification device according to claim 2, wherein the first multiplexer/demultiplexer circuit is configured to be separable from the light source circuit and the second multiplexer/demultiplexer circuit.

* * * * *